(12) United States Patent
Still et al.

(10) Patent No.: US 7,291,023 B1
(45) Date of Patent: Nov. 6, 2007

(54) ELECTRIC VEHICLE MOTION SENSOR

(75) Inventors: Charles Still, Clinton, MI (US); Hans Graan, Motala (SE)

(73) Assignee: Autoliv ASP, Inc., Ogden, UT (US)

( * ) Notice: Subject to any disclaimer, the term of this patent is extended or adjusted under 35 U.S.C. 154(b) by 0 days.

(21) Appl. No.: 11/602,682

(22) Filed: Nov. 21, 2006

(51) Int. Cl.
*H01R 12/00* (2006.01)

(52) U.S. Cl. .................... 439/76.1; 439/65; 439/67; 439/913

(58) Field of Classification Search ............... 439/76.1, 439/65, 67, 913
See application file for complete search history.

(56) References Cited

U.S. PATENT DOCUMENTS

| | | | |
|---|---|---|---|
| 4,689,721 A | * | 8/1987 | Damerow et al. .......... 361/707 |
| 6,398,252 B1 | | 6/2002 | Ishikawa et al. |
| 6,416,139 B2 | * | 7/2002 | Warner et al. ........... 303/119.3 |
| 6,442,027 B2 | * | 8/2002 | Sanada et al. .............. 361/704 |
| 6,511,328 B2 | * | 1/2003 | Molus et al. ............... 439/76.1 |
| 2001/0017766 A1 | * | 8/2001 | Murowaki et al. .......... 361/752 |

* cited by examiner

*Primary Examiner*—Tho D. Ta
(74) *Attorney, Agent, or Firm*—Sally J Brown; Brinks Hofer Glison & Lione

(57) ABSTRACT

A motor vehicle motion sensor assembly includes a daughter board assembly having an alignment feature, a circuit board having electronic components, and a housing element having a receiving feature for receiving the daughter board assembly. The circuit board is electrically connected with the daughter board assembly by a flexible electrical connector. The circuit board is further connected with an external circuit connector. The alignment feature of the daughter board assembly is adapted to engage the receiving feature of the housing element.

17 Claims, 7 Drawing Sheets

ELECTRIC VEHICLE MOTION SENSOR

BACKGROUND

1. Field of the Invention

This invention generally relates to motor vehicle sensor system assemblies. More specifically, the invention relates to motor vehicle sensor system assemblies having sensors to determine the occurrence of a change in vehicle attitude or motion.

2. Description of Related Art

In motor vehicle design, vehicle safety systems are becoming increasingly important. To that end, vehicles often include sensor systems used to alert the driver, and in some cases, to automatically deploy certain safety and dynamic stability systems. Sensor systems may be configured to trigger vehicle safety systems or vehicle reaction systems, such as deployment of airbags, automatic braking, or reduction of engine torque upon the occurrence of predetermined conditions. For example, electronic stability control (ESC) systems automatically control vehicle functions to control loss of directional stability or intervene where vehicle rollover conditions are present. In such systems, vehicles contain sensor elements that sense surrounding events and kinematic conditions, such as acceleration.

Sensing assemblies, which may contain a number of sensing devices such as accelerometers or angular rate sensors, continuously sense data and provide it to a main circuit board that further provides the data to a control unit. The sensing assemblies are typically in electrical and mechanical communication with the main circuit board, and the main circuit board is in electrical communication with the control unit. If the sensing assemblies sense a change that exceeds a predetermined threshold, the control unit will deploy relevant safety and/or vehicle reaction systems. Since inadvertent deployment of safety systems or vehicle reaction systems is highly undesirable, the control unit needs to reliably detect these events.

Thus, such sensor packages must reliably operate while being subjected to vibrations and other interferences. One source of vibration and noise is the main circuit board itself, since the sensing assemblies are typically mechanically coupled to the main circuit board, which has electrical cabling attached.

In view of the above, it is apparent that there exists a need for a sensor assembly package capable of more reliably transmitting data, in order to avoid erroneous deployment of safety systems or reaction systems.

SUMMARY OF THE INVENTION

Accordingly, a sensor assembly for electronic vehicle attitude and/or motion detection is provided in accordance with this invention. The motor vehicle sensor assembly includes at least one daughter board assembly having one or more sensors and having an alignment feature. The sensor assembly also includes a circuit board that has electronic components. The circuit board is electrically connected with the daughter board assembly using a flexible electrical connector. The circuit board is further connected to other electronics with an external circuit connector. In addition, the sensor assembly includes a housing that has at least one receiving feature. The receiving feature is adapted to receive and engage the alignment feature of the daughter board assembly.

The circuit board is mounted to the housing. Furthermore, the daughter board assembly is preferably mounted to the housing at a substantially right angle to the plane of the circuit board. The daughter board assembly may have a sensor adapted to sense acceleration. The daughter board assembly is electrically connected to the circuit board, which may be through the use of a flexible printed circuit board, flexible cable, solder reflow, conductive adhesive, pins, or another suitable connector.

The daughter board assembly is positioned spaced from the circuit board. One way this spaced relationship is accomplished is by aligning the daughter board assembly with the receiving feature of the housing and inserting the daughter board assembly into a pocket located within the wall of the housing. The receiving feature incorporates a retention feature operable to transfer vehicle motion to the daughter board assembly. Vehicle attitude could also be transferred through the use of the retention feature. The retention feature includes an element that causes an interference fit between the daughter board assembly and the housing.

There is further provided a sensor assembly as previously described wherein the circuit board and the daughter board assembly are mounted to the housing element, which can be a lid of the housing. In one embodiment, the receiving feature of the housing lid is an upstanding wall. A clip acts as a retention feature to hold the daughter board assembly to the receiving feature.

Damping compound may be used in the sensor assembly to dampen the response of the daughter board assembly. The damping compound may be disposed between the daughter board assembly and the housing element.

Furthermore, the sensor assembly may include a mounting structure adapted to mount the sensor assembly to an outside object.

In another aspect, the sensor assembly is adapted to sense acceleration in at least two orthogonal directions. This may be accomplished by placing a plurality of daughter board assemblies in the sensor assembly, each oriented to sense acceleration on a plane located about ninety degrees from the sensing plane of each other daughter board assembly.

In another aspect, a motor vehicle sensor assembly includes a circuit board having electronic components and a housing having at least one receiving feature, with the circuit board being electrically connected with an external circuit connector. In this aspect, the circuit board has a flexible portion separating a first rigid portion from a second rigid portion. The first rigid portion comprises a main circuit board and the second rigid portion comprises a daughter board assembly. The second rigid portion has an alignment feature that is adapted to be engaged with the receiving feature of the housing.

Further areas of applicability and additional advantages will become apparent to those skilled in the art from the subsequent description and specific examples provided hereinafter, the appended claims, and the accompanying drawings. It should be noted that the following examples and variations are intended for illustrative purposes only and are not intended to limit the invention.

DETAILED DESCRIPTION OF THE INVENTION

The following description is merely exemplary in nature and is no way intended to limit the invention, its application, or uses.

Figure 1:
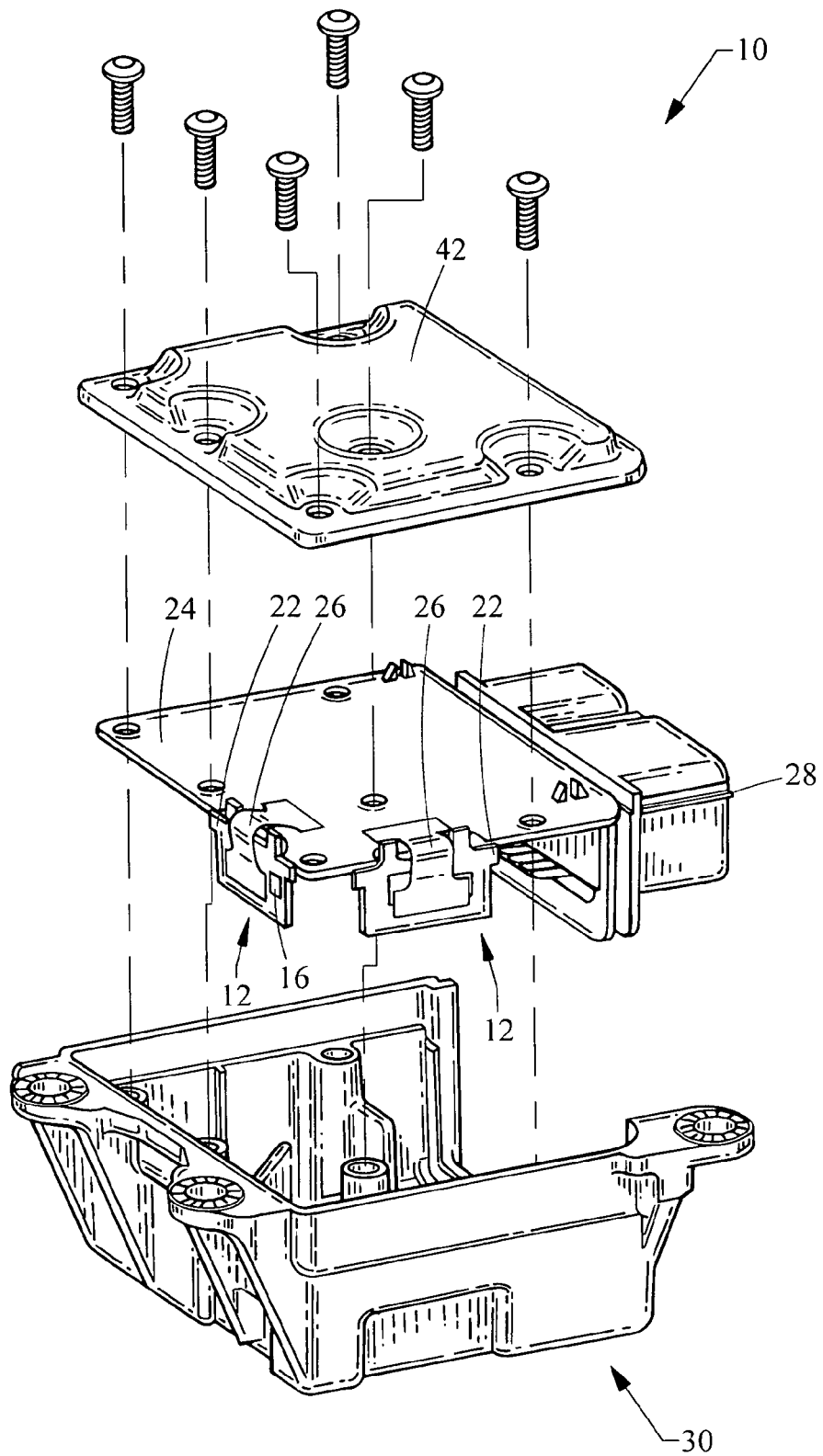
FIG. 1 is an exploded, perspective view of a first embodiment of a sensor assembly.

With reference to FIG. 1, a sensor assembly 10 for electronic vehicle motion detection is provided. The sensory assembly 10 could also be used to detect vehicle attitude. The sensor assembly 10 includes a pair of daughter board assemblies 12. FIG. 1 shows two daughter board assemblies 12, one of which is a roll angular rate sensor (roll ARS) assembly and the other of which is a pitch angular rate sensor (pitch ARS) assembly. The daughter board assemblies 12 each include a daughter printed circuit board adapted to sense acceleration through the use of an accelerometer 16. One daughter board assembly 12 senses changes in roll angle through a roll angular rate sensor (ARS) 18 and the other daughter board assembly 12 senses pitch angle through a pitch angular rate sensor (ARS) 20, shown in FIG. 2. The daughter board assemblies 12 may also include various other electrical components, such as, for example, filtering devices, capacitors, resistors, and other associated components used for noise reduction. Furthermore, each daughter board assembly 12 has an alignment feature 22, shown as a laterally extending tab.

The sensor assembly 10 includes a circuit board 24 that has electronic components (not shown). The circuit board 24 is electrically connected to the daughter board assemblies 12 using a flexible electrical connector 26, such as a flexible printed circuit board. The flexible connector 26 may also, or in the alternative, comprise flexible cable terminated by solder reflow, conductive adhesive, or pins. The circuit board 24 is connected to other electronic components (not shown) with an external circuit connector 28.

Figure 2:
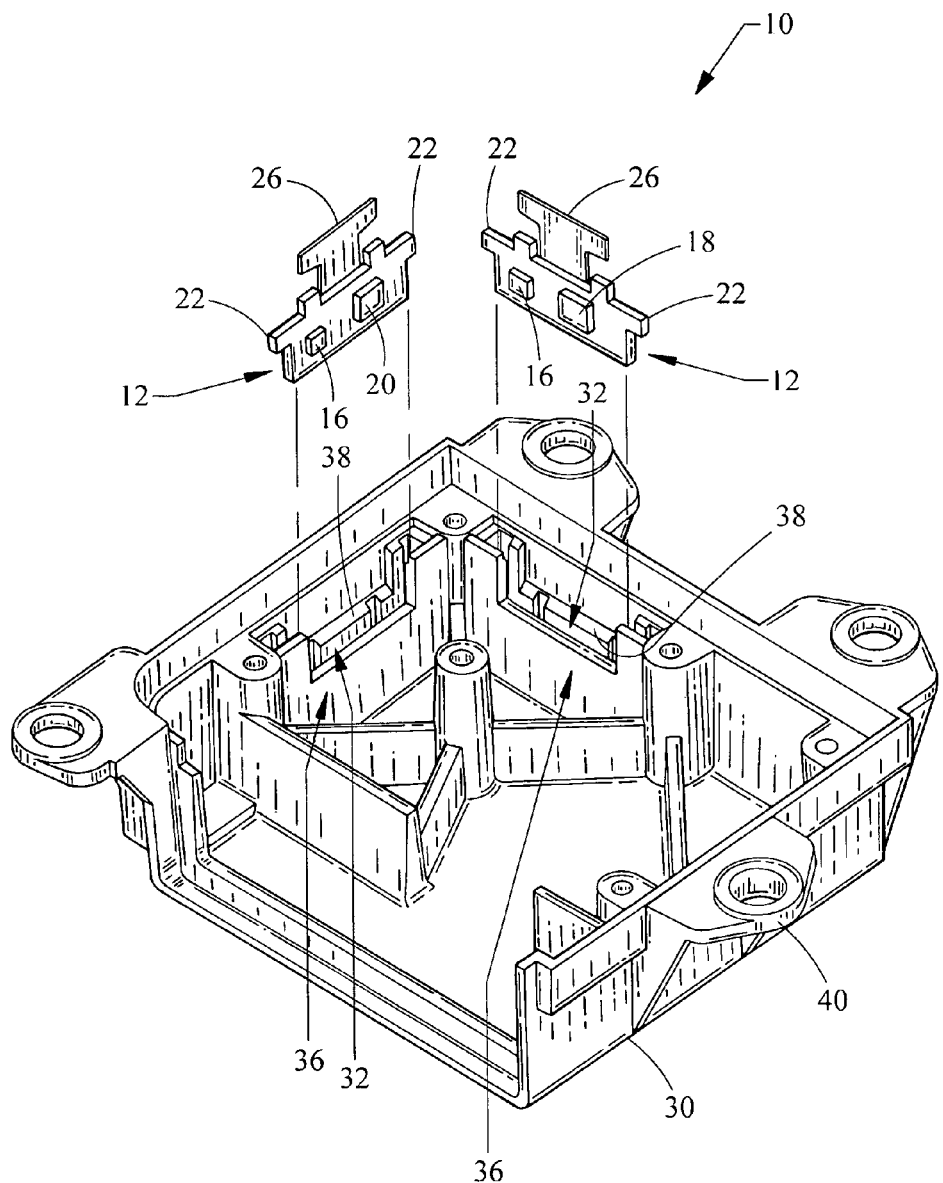
FIG. 2 is a perspective view of the housing of the sensor assembly of FIG. 1, along with two daughter board assemblies.

In addition, the sensor assembly 10 includes a housing element, which in this embodiment is a tub-shaped housing 30. With reference to FIG. 2, the housing 30 has at least one receiving feature, shown as a slot or pocket 32. FIG. 2 shows a housing 30 with two pockets 32, one for each daughter board assembly 12. The pockets 32 are adapted to receive the daughter board assemblies 12 and engage the alignment features 22 of the daughter board assemblies 12.

Figure 3:
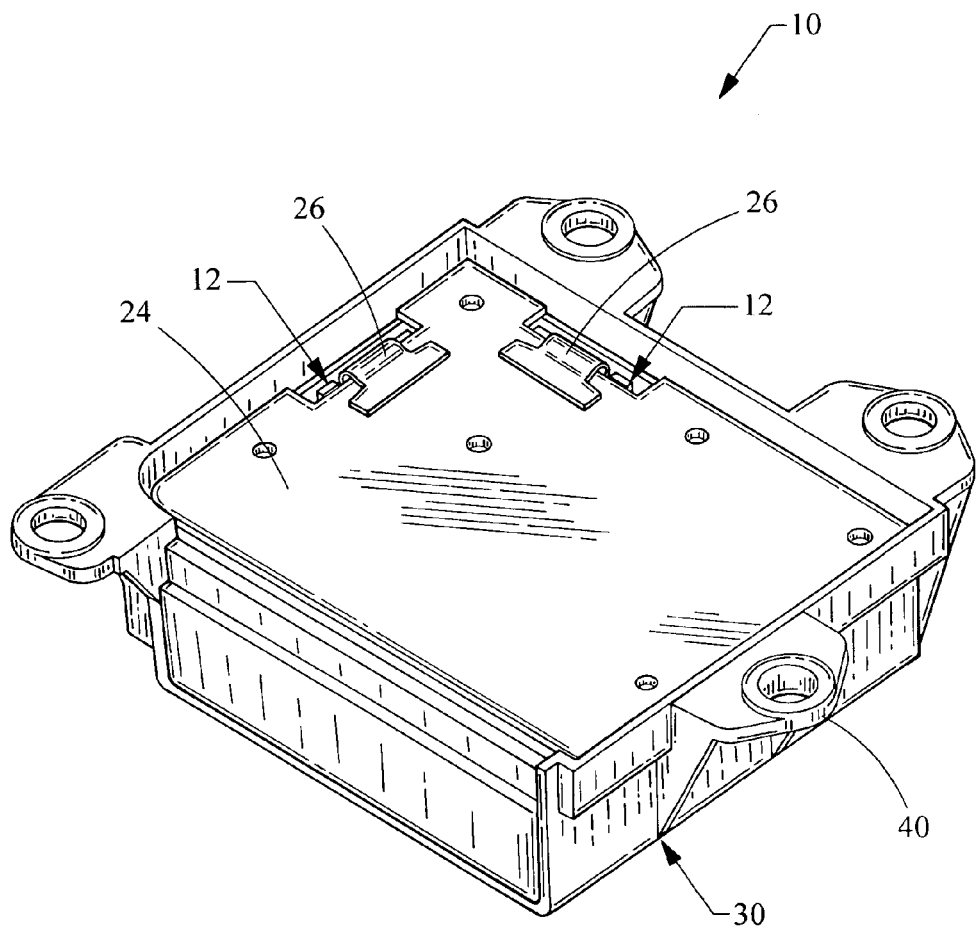
FIG. 3 is a perspective view of the sensor assembly of FIG. 1, showing the daughter board assemblies and the circuit board mounted to the housing.

With reference to FIG. 3, a partially assembled sensor assembly 10 is shown, wherein the alignment features 22 of the daughter board assemblies 12 are engaged with the pockets 32 of the housing 30. The circuit board 24 is mounted to the housing 30, and the daughter board assemblies 12 are mounted to the housing 30, oriented at a substantially right angle to the plane of the circuit board 24. The daughter board assemblies 12 are electrically connected to the circuit board 24, through the use of flexible connectors 26. It is preferable to first connect the daughter board assemblies 12 to the circuit board 24 using the flexible connectors 26, as shown in FIG. 1, before inserting the daughter board assemblies 12 into the pockets 32 of the housing 30. Alternatively, it is also possible to first insert the daughter board assemblies 12 into the pockets 32 of the housing 30, and subsequently connect the flexible connectors 26 from the daughter board assemblies 12 to the circuit board 24.

The daughter board assemblies 12 are positioned spaced from the circuit board 24 (see FIGS. 1 and 3). This arrangement allows the daughter board assemblies 12 to be mechanically decoupled from the circuit board 24. With reference to FIG. 2, one way this spaced relationship is accomplished is by aligning the daughter board assemblies 12 with the pockets 32 of the housing 30 and inserting the daughter board assemblies 12 into pockets 32 located within the walls 36 of the housing 30. In order to hold the daughter board assemblies 12 in place, the pockets 32 incorporate retention features 38 operable to hold the daughter board assemblies 12 in place. The retention features 38 hold the daughter board assemblies 12 in place through an interference fit between the daughter board assemblies 12 and the walls 36 of the housing 30. This allows the effective coupling of vehicle motion (and possibly vehicle attitude) to the daughter board assemblies 12, because the daughter board assemblies 12 are thereby firmly held to the housing 30, and the sensor assembly 10 includes a mounting structure 40 adapted to mount the sensor assembly 10 to a mounting surface, such as the frame or body of a vehicle.

Damping compound, such as elastomeric foam (not shown), may be used in the sensor assembly 10 to dampen the response of the daughter board assemblies 12. The damping compound may fill the area between the daughter board assemblies 12 and the housing 30. More specifically, it is advantageous to fill the pockets 32 with damping compound around the daughter board assemblies 12. Furthermore, damping compound may be disposed between the printed circuit board 24 and the lid 42 of the housing 30.

Referring to FIGS. 1-3, the sensor assembly 10 is adapted to sense inertial change in at least two orthogonal directions. In other words, the sensor assembly 10 of FIGS. 1-3 is capable of sensing inertial changes in an X-direction and a Y-direction, since each daughter board assembly 12 is oriented to sense inertial change on a plane located about ninety degrees from the sensing plane of each other daughter board assembly 12. A third daughter board assembly could be oriented along a plane in a Z-direction that is oriented orthogonal from both of the shown daughter board assemblies 12 that are located along an X-axis and a Y-axis.

Figure 4:
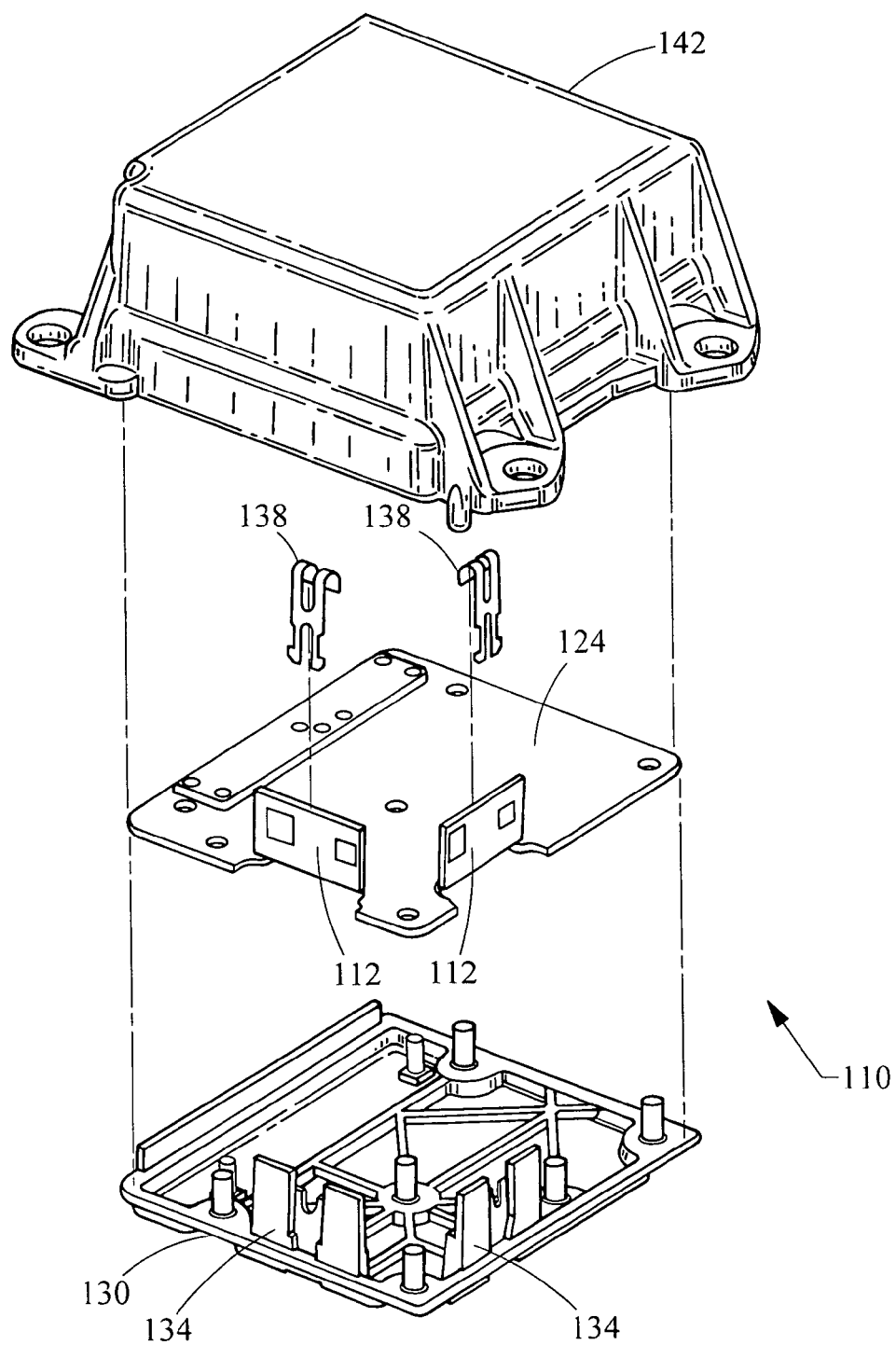
FIG. 4 is an exploded, perspective view of a second embodiment of a sensor assembly.
Figure 5:
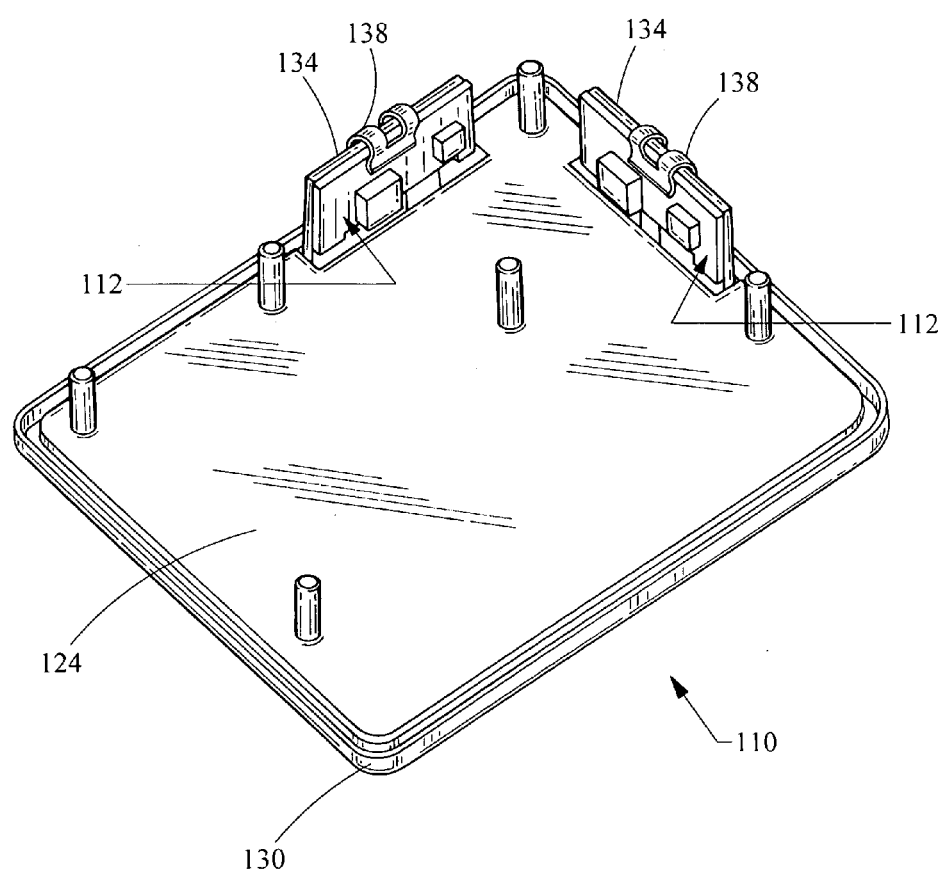
FIG. 5 is a perspective view of the sensor assembly of FIG. 4, showing the housing lid with the daughter board assemblies and the circuit board mounted thereon.

Another variation of the sensor assembly 110 is shown as a second embodiment in FIGS. 4-5. In this variation, the daughter board assemblies 112 and circuit board 124 are mounted to the housing lid 130. The receiving feature on the housing lid 130 is an upstanding wall 134. The housing lid 130 on which the upstanding wall 134 is located is the lid of the sensor assembly 110. Similar to the variation shown in FIGS. 1-3, in this variation, the daughter board assemblies 112 are positioned spaced from the circuit board 124. Clips 138 act as a retention feature to hold the daughter board assemblies 112 to the upstanding walls 134. After the daughter board assemblies 112 and the circuit board 124 are secured to the housing lid 130, the housing body 142 of the sensor assembly 110 (shown in FIG. 4) is secured to the housing lid 130.

In the variation of FIGS. 4-5, damping compound, such as elastomeric foam (not shown), may be used in the sensor assembly 110 to dampen the response of the daughter board assemblies 112. The damping compound may be disposed between the daughter board assemblies 112 and the housing lid 130. Furthermore, damping compound may be disposed between the circuit board 124 and the housing lid 130.

Damping compound could also be disposed between the circuit board 124 and the housing body 142 of the sensor assembly 110. Other aspects of this variation are similar to the embodiment shown in FIGS. 1-3.

Figure 6:
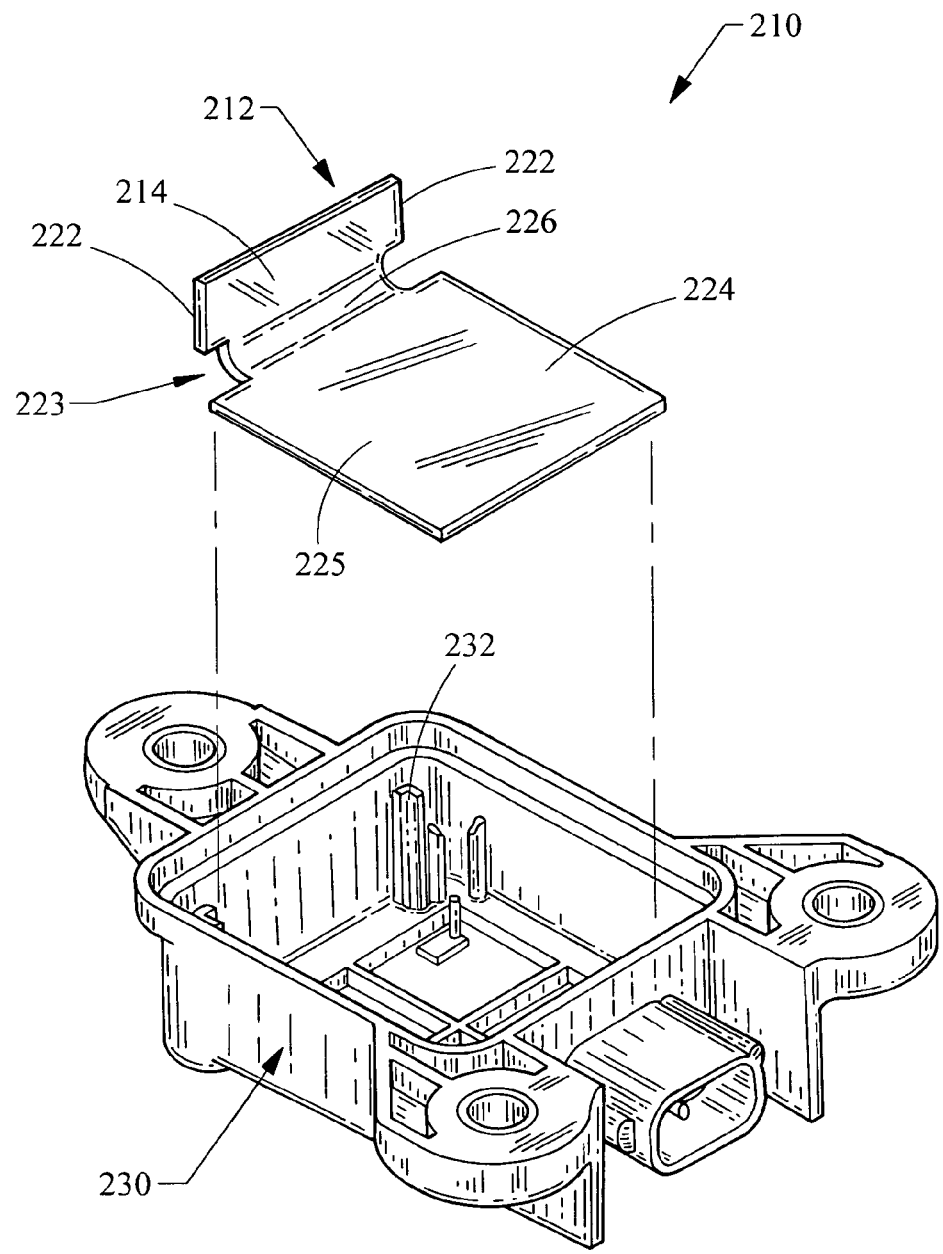
FIG. 6 is an exploded, perspective view of a third embodiment of a sensor assembly.
Figure 7:
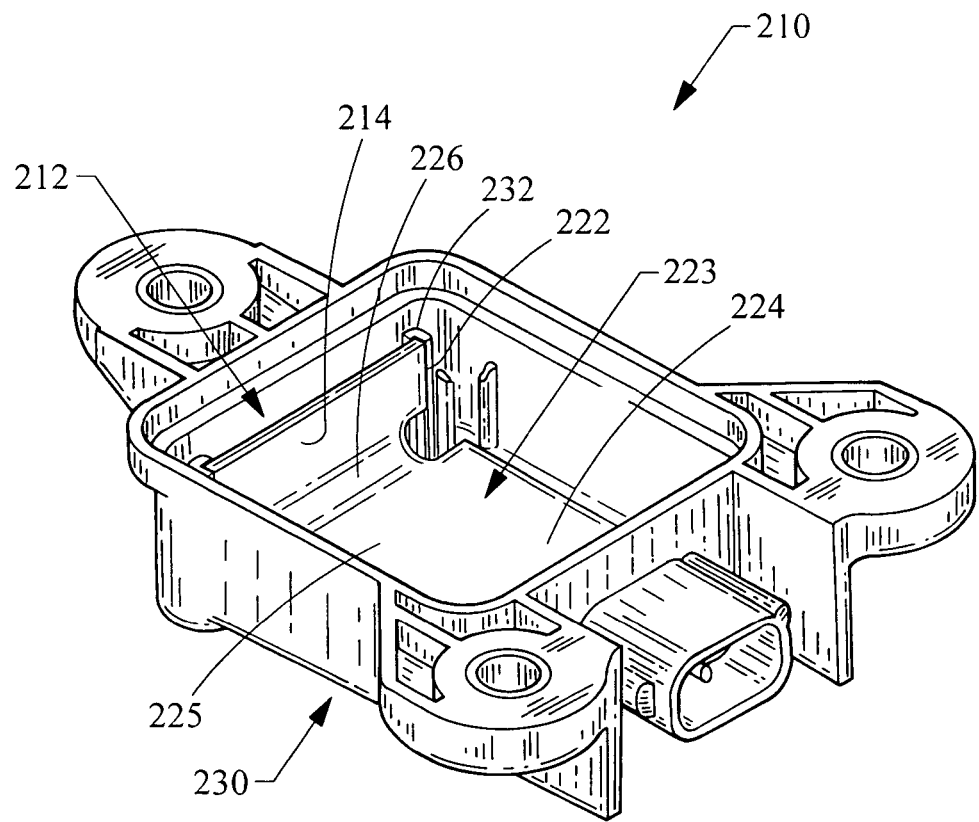
FIG. 7 is a perspective view of the sensor assembly of FIG. 6.

Referring to FIGS. 6-7, a third embodiment of a motor vehicle sensor assembly 210 is shown. A circuit board 223 having electronic components (not shown) has a flexible portion 226 separating a first rigid portion 224 comprising a main circuit board 225 from a second rigid portion 212 comprising a daughter board assembly 214. The daughter board assembly 214 includes sensors (not shown) similar to the features of the daughter board assemblies 12 of FIGS. 1-2, such as an accelerometer 16 and an angular rate sensor (ARS) 18, 20.

In the sensor assembly 210 of FIGS. 6-7, the housing 230 includes receiving features 232, in the form of sleeves, slots, or pockets, that are adapted to receive and engage alignment features 222 of the second rigid portion 212 of the circuit board 223. FIG. 7 shows the first rigid portion 224 of the circuit board 223 mounted to the bottom of the housing 230, while the second rigid portion 212 of the circuit board 223 is mounted by engaging the alignment features 222 of the second rigid portion 212 of the circuit board 223 with the receiving features 232 of the housing 230.

Referring to FIGS. 6-7, the flexible portion 226 that separates the first rigid portion 224 from the second rigid portion 212 may be formed by milling away portions of circuit board 225. Such milling away makes the flexible portion 226 thinner and consequently more flexible. The flexible portion 226 allows the second rigid portion 212 of the circuit board 223 to be folded upward and held in the housing 230 at an angle of about ninety degrees from the plane of the first rigid portion 224 of the circuit board 223. This arrangement allows the daughter board assembly 214 and the main circuit board 225 to be electrically connected through the flexible portion 226 of the circuit board 223, while isolating some of the motion and vibration originating with the main circuit board 225 from the daughter board assembly 214. It is contemplated that this arrangement may be suitable for use in a crash sensor package.

As a person skilled in the art will readily appreciate, the above description is merely an illustration of implementation of the principles of the claimed invention. The description is not intended to limit the scope or application of this invention in that the invention is susceptible to modification, variation, and change, without departing from the spirit of this invention, as defined in the following claims.

We claim:

1. A motor vehicle motion sensor assembly comprising:
a housing element;
at least one daughter board assembly mounted to the housing element, the daughter board assembly having at least one alignment feature and at least one kinematic sensor;
a circuit board having electronic components, the circuit board mounted to the housing element, the circuit board electrically connected with the daughter board assembly by a flexible electrical connector, and the circuit board further connected with an external circuit connector; wherein,
the housing element has at least one receiving feature for the daughter board assembly; and,
the alignment feature of the daughter board assembly is adapted to engage the receiving feature of the housing element, thereby holding the daughter board assembly in a position spaced apart from the circuit board to mechanically decouple the kinematic sensor from the circuit board.

2. The sensor assembly of claim 1, wherein the receiving feature is a pocket located in a wall of the housing element.

3. The sensor assembly of claim 1, wherein the daughter board assembly is mounted to the housing element at a substantially right angle to the plane of the circuit board.

4. The sensor assembly of claim 1, wherein the receiving feature is an upstanding wall located on the housing element.

5. The sensor assembly of claim 1, wherein the housing element is a lid of the sensor assembly.

6. The sensor assembly of claim 1, wherein the daughter board assembly comprises a daughter printed circuit board.

7. The sensor assembly of claim 1, further comprising a mounting structure adapted to mount the sensor assembly to an outside object.

8. The sensor assembly of claim 1, wherein the sensor assembly is adapted to sense change in at least two orthogonal directions.

9. The sensor assembly of claim 1, wherein the flexible connector is integrally formed with the circuit board and the daughter board assembly.

10. The sensor assembly of claim 1, wherein the receiving feature incorporates a retention feature operable to transfer at least one of vehicle attitude and vehicle motion to the daughter board assembly.

11. The sensor assembly of claim 10, wherein the retention feature causes an interference fit between the daughter board assembly and the housing element.

12. The sensor assembly of claim 10, wherein the retention feature is a clip.

13. The sensor assembly of claim 1, wherein the daughter board assembly is adapted to sense acceleration.

14. The sensor assembly of claim 13, wherein the daughter board assembly comprises at least one accelerometer.

15. The sensor assembly of claim 1, further comprising damping compound adapted to dampen the response of the daughter board assembly.

16. The sensor assembly of claim 15, wherein the damping compound is disposed between the daughter board assembly and the housing element.

17. A motor vehicle motion sensor assembly comprising:
a housing element;
a plurality of daughter board assemblies mounted to the housing element, the daughter board assemblies each having at least one alignment feature and at least one kinematic sensor, and each daughter board assembly oriented to sense change on a plane located about ninety degrees from the sensing plane of each other daughter board assembly;
a circuit board having electronic components, the circuit board mounted to the housing element, the circuit board electrically connected with the daughter board assemblies by a plurality of flexible electrical connectors, and the circuit board further connected with an external circuit connector; wherein,
the housing element has a plurality of receiving features for engaging the daughter board assemblies; and,
the alignment features of the daughter board assemblies are adapted to engage the receiving features of the housing element.

* * * * *